(12) United States Patent  (10) Patent No.: US 8,054,701 B2
Ku  (45) Date of Patent: Nov. 8, 2011

(54) DELAY LOCKED LOOP AND SEMICONDUCTOR MEMORY DEVICE WITH THE SAME

(75) Inventor: Young-Jun Ku, Kyoungki-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 143 days.

(21) Appl. No.: 12/615,833

(22) Filed: Nov. 10, 2009

(65) Prior Publication Data

US 2010/0054060 A1 Mar. 4, 2010

Related U.S. Application Data

(62) Division of application No. 12/003,552, filed on Dec. 28, 2007, now Pat. No. 7,639,552.

(30) Foreign Application Priority Data

Mar. 29, 2007 (KR) .............................. 2007-0030707

(51) Int. Cl.
    *G11C 7/00* (2006.01)
(52) U.S. Cl. .................. 365/194; 365/193; 365/233.1; 365/233.12; 327/156; 327/158; 327/296
(58) Field of Classification Search .................. 365/194, 365/233.1, 233.12, 193; 327/156, 158, 296
    See application file for complete search history.

(56) References Cited

U.S. PATENT DOCUMENTS

| 6,438,060 | B1 | 8/2002 | Li et al. | |
| 6,825,703 | B1* | 11/2004 | Kwak | 327/158 |
| 6,928,007 | B2* | 8/2005 | Jin | 365/194 |
| 7,430,143 | B2* | 9/2008 | Choi | 365/194 |
| 7,489,170 | B2* | 2/2009 | Ku et al. | 327/158 |
| 7,605,622 | B2* | 10/2009 | Choi et al. | 327/158 |
| 7,639,552 | B2* | 12/2009 | Ku | 365/194 |
| 7,676,686 | B2* | 3/2010 | Ku et al. | 713/600 |
| 2006/0250877 | A1 | 11/2006 | Smith et al. | |

FOREIGN PATENT DOCUMENTS

KR 1020030092506 A 6/2003
KR 1020050041196 5/2005

OTHER PUBLICATIONS

Notice of Allowance issued from Korean Intellectual Property Office on Feb. 7, 2011.
Lee et al., "Design of CMOS Analog/Mixed-Mode Integrated System vol. 2", Sigma Press, 1999, pp. 307-308, 311, 330-331, South Korea.
Examiner's Answer to Appeal Brief as filed with the Patent Court of Korea: Jan. 13, 2010.

* cited by examiner

*Primary Examiner* — Viet Q Nguyen
(74) *Attorney, Agent, or Firm* — IP & T Group LLP (57) ABSTRACT

A semiconductor memory device is capable of controlling a delay locked loop appropriately based on operation modes, particularly in a fast power-down mode to reduce an amount of current maximumly. The semiconductor memory device includes a delay-locked clock signal generating unit, a mode signal generating unit, and a delay locking control unit. The delay-locked clock signal generating unit performs a delay locking operation on a clock signal, thereby generating a delay-locked clock signal. The mode signal generating unit enables a fast precharge power-down mode signal in a fast precharge power-down mode. The delay locking control unit controls the delay-locked clock signal generating unit to be activated in a predetermined cycle in response to the fast precharge power-down mode signal.

7 Claims, 6 Drawing Sheets

DELAY LOCKED LOOP AND SEMICONDUCTOR MEMORY DEVICE WITH THE SAME

CROSS-REFERENCE TO RELATED APPLICATIONS

This application is a division of U.S. patent application Ser. No. 12/003,552 filed on Dec. 28, 2007, now U.S Pat. No. 7,639,552 which claims priority of Korean patent application number 10-2007-0030707 filed on Mar. 29, 2007. The disclosure of each of the foregoing applications is incorporated herein by reference in its entirety.

BACKGROUND OF THE INVENTION

The present invention relates to a semiconductor memory device; and, more particularly, to a delay locked loop (hereinafter, referred to as "DLL") circuit of the semiconductor memory device.

In a system equipped with a plurality of semiconductor devices for performing various functions, a semiconductor memory device functions as an apparatus for storing data. The semiconductor memory device outputs data, which are corresponding to the address signals inputted from a data processing unit, for example, a central processing unit, to a device to request the data, or stores data delivered by the data processing unit in unit cells corresponding to the address signals which are inputted together with the data.

The operating speed of the system is getting faster and faster. Therefore, the semiconductor memory devices are more and more required to have fast input and output speed of the data processing unit. Recently, the operating speed of the data processing unit is getting faster and faster in the engineering development process of the semiconductor integrated circuits; however, the semiconductor memory devices to deliver the data to the data processing unit is not in compliance with the input and output speed of the data processing unit.

In order to enhance the data I/O speed of the semiconductor memory device to a degree which is required by the data processing unit, various semiconductor memory devices have been developed up to now. Synchronous memory devices in which the data are inputted and outputted in response to system clock signals have been proposed until a recent date. The synchronous memory devices output the data to the data processing unit in response to the inputted system clock signals and also receive the data from the data processing unit in response to the inputted system clock signals. However, since the synchronous memory devices are unable to follow the operating speed of the data processing unit, DDR synchronous memory devices have been developed. The DDR synchronous memory devices input and output the data in response to a transition time of the system clock signal. That is, in the DDR synchronous memory devices, the data are inputted and outputted in synchronization with rising and falling edges of the system clock signal.

However, the system clock signal inputted into the semiconductor memory device reaches to a data output circuit, inevitably having a delay time which is caused by both a clock input buffer disposed within the memory device and a transmission line to transmit the clock signal thereto. Therefore, when the data output circuit outputs the data in synchronization with the system clock signals which already have such a delay time, an external circuit which receives the output data from the semiconductor memory device may take them asynchronously with the rising edge and the falling edge of the system clock signal.

To solve this problem, the semiconductor memory device includes a delay locked loop for locking an amount of the delay time of the clock signal. The delay locked loop is a circuit to compensate for the delay time which is caused by the internal circuits in the memory device until the system clock signal is delivered to the data output circuit after inputted to the memory device. The delay locked loop finds out an amount of the delay time of the system clock signal which is caused by delay circuits, such as the input buffer and the clock signal transmission line, and delays the system clock signal based on the delay amount which has been found. The delay locked loop outputs the delayed system clock to the data output circuit. That is, the system clock signal inputted into the memory device is delivered to the data output circuit with a fixed delay time by the delay locked loop. The data output circuit outputs the data in synchronization with the delay-locked clock signal and the external circuit regards the output data as the normal data which are accurately outputted in synchronization with the system clock signal.

In an actual operation, the delay-locked clock signal outputted by the delay locked loop is transferred to an output buffer at a point of time which is determined faster than the data output time by one period of time and the data are outputted in synchronization with the transferred delay-locked clock signal. As a result, the data are more rapidly outputted than the amount of delay time of the system clock signals caused by the internal circuits of the memory device. In this way, it seems to the external circuit of the memory device that the data are accurately outputted in synchronization with the rising edge and the falling edge of the system clock signal. In conclusion, the delay locked loop is a circuit to find out a delay value to compensate for the delay time of the system clock signal within the memory device, thereby achieving the fast data output operation.

With the development of the semiconductor manufacture technologies, the operation modes of the semiconductor memory device become various, for the semiconductor memory device to optimally operate according to the operation state of the system. A power-down mode is an operation mode for saving the power of the semiconductor memory device when it does not access the data. Recently, the power-down mode is classified into a precharge power-down mode and an active power-down mode. The active power-down mode is carried out when the semiconductor memory device enters the power-down mode in a state where word lines are activated to access the data and the precharge power-down mode is carried out when the semiconductor memory device enters the power-down mode in a precharge state. The precharge power-down mode is classified into a fast power-down mode and a slow power-down mode. Generally, in the fast power-down mode, the delay locked loop normally operates in a normal mode and the delay locked loop does not operate in the slow power-down mode. The semiconductor memory device operates in the fast power-down mode or the slow power-down mode based on a set value set in a register which is called as an MRS.

Since the delay locked loop carries out the operation of locking the delay of the clock signals, the delay locked loop exhausts the relatively large amount of current as compared to other circuits of the semiconductor memory devices. The demand on the fast operation speed of the semiconductor memory device increases more and more and the low-power consumption is required more and more. Therefore, it is necessary to control the delay locked loop appropriately based on the operation modes.

SUMMARY OF THE INVENTION

An embodiment of the present invention is directed to providing a semiconductor memory device capable of controlling a delay locked loop appropriately based on operation modes. Also, it is directed to providing a semiconductor memory device capable of controlling a delay locked loop in a power-down mode, particularly in a fast power-down mode in order to reduce an amount of current maximumly.

In accordance with an aspect of the present invention, a semiconductor memory device includes a delay-locked clock signal generating unit for performing a delay locking operation on a clock signal, thereby generating a delay-locked clock signal, a mode signal generating unit for enabling a fast precharge power-down mode signal in a fast precharge power-down mode, and a delay locking control unit for controlling the delay-locked clock signal generating unit to be activated in a predetermined cycle in response to the fast precharge power-down mode signal.

In accordance with another aspect of the present invention, a semiconductor memory device includes a clock buffer unit for generating a reference and an internal clock signals in response to a clock signal, a clock buffer control unit for activating the clock buffer unit every predetermined number of cycles in a fast precharge power-down mode, and a delay locked loop for performing a delay locking operation on the internal clock signal, thereby generating a delay locked clock signal.

In accordance with a further aspect of the present invention, a method for driving a semiconductor memory device includes generating a reference and an internal clock signal using a clock signal, selectively controlling a generation of the reference clock signal in a predetermined number of cycles in a fast precharge power-down mode, and generating a delay locked clock signal through a delay locking operation, using the reference and the internal clock signals.

DESCRIPTION OF SPECIFIC EMBODIMENTS

Hereinafter, a semiconductor memory device in accordance with the present invention will be described in detail referring to the accompanying drawings.

Figure 1:
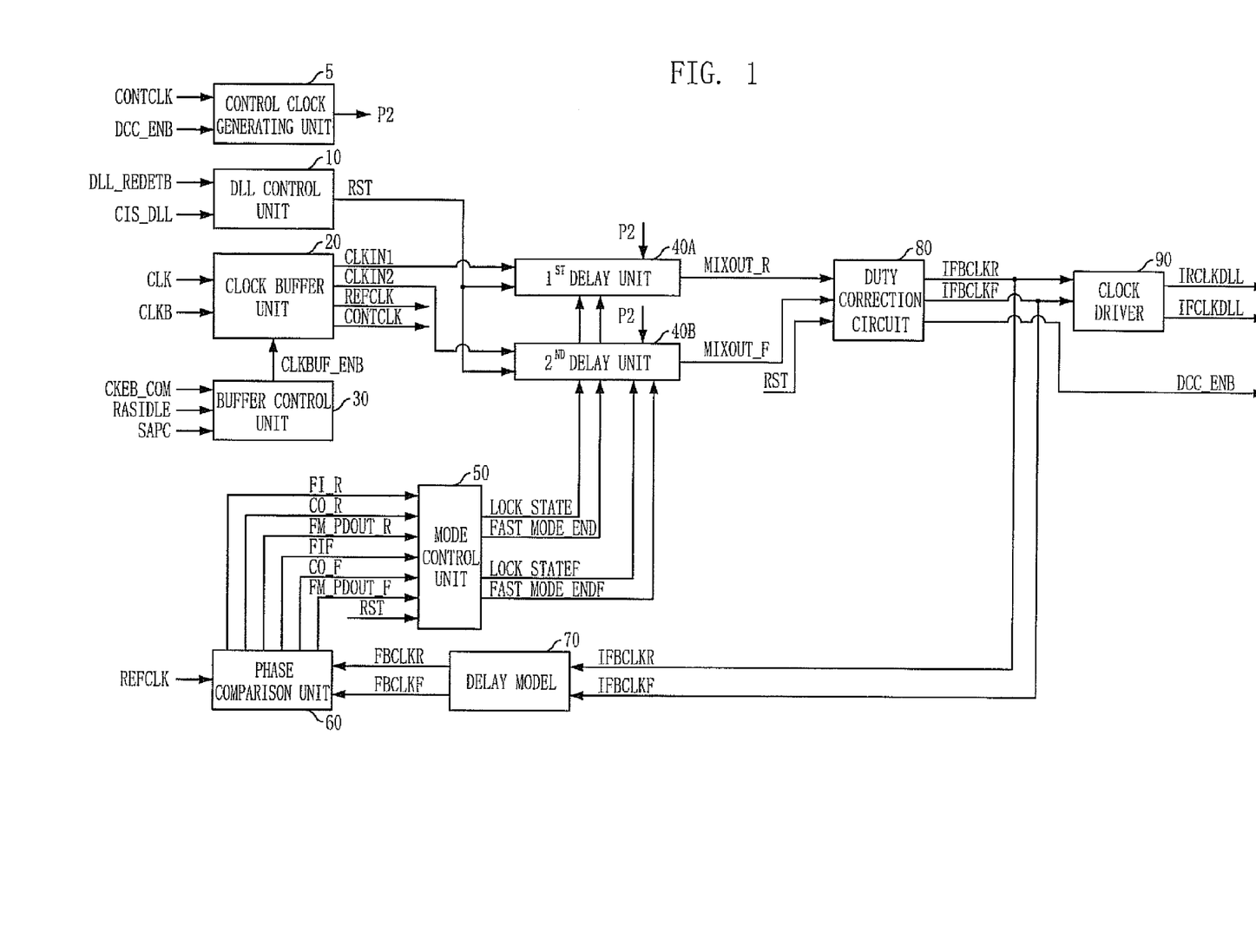
FIG. 1 is a block diagram illustrating a semiconductor memory device.

FIG. 1 is a block diagram of a semiconductor memory device and a delay lock loop is particularly and mainly shown in FIG. 1. Referring to FIG. 1, the semiconductor memory device includes a control clock generating unit 5, a DLL control unit 10, a clock buffer unit 20, a buffer control unit 30, a first delay unit 40A, a second delay unit 40B, a mode control unit 50, a phase comparison unit 60, a delay model 70, a duty correction unit 80, and a clock driver 90.

The control clock generating unit 5 receives an enable signal DCC_ENb and a control clock signal CONTCLK and then generates an update reference clock signal P2. The DLL control unit 10, which receives control signals DLL_REDELB and CIS_DLL, generates a reset signal RST. The clock buffer unit 20 receives clock signals CLK and CLKB and then generates first and second internal clock signals CLKIN1 and CLKIN2, a reference clock signal REFCLK and a control clock signal CONTCLK by buffering the received clock signals CLK and CLKB. The buffer control unit 30 receives an internal clock enable signal CKEB_COM, an active idle signal RASIDLE, an MRS setting signal SAPC and generates a clock buffer enable signal CLKBUF_ENB in order to enable the clock buffer unit 20. The internal clock enable signal CKEB_COM is a buffered signal which is produced by buffering the clock enable signal inputted from the semiconductor memory device. The active idle signal RASIDLE is a signal, which is produced by decoding a command signal inputted from an external circuit in a command decoder (not shown), and is used as a signal indicative of an active state. The MRS setting signal SAPC is a signal which is provided based on information stored in an MRS register and this signal indicates one of the fast and slow precharge modes in the operation mode of the semiconductor memory device.

The first delay unit 40A outputs a clock signal MIXOUT_R which is produced by delaying the first internal clock signal CLKIN1 under the control of the mode control unit 50. The second delay unit 40B outputs a clock signal MIXOUT_F which is produced by delaying the second internal clock signal CLKIN2 under the control of the mode control unit 50, Typically, the delay locked loop includes a coarse delay unit having a unit delay chain composed of unit delayers, a fine delay unit which minutely controls the delay time more than the unit delayer, and a delay control unit to control the coarse and fine delay units according to the result of the phase comparison unit. In FIG. 1, for convenience's sake, all of the coarse delay unit, the fine delay unit and the delay control unit are included in each circuit block of the first and second delay units 40A and 40B. Also, the first and second delay units 40A and 40B respectively correct an amount of the delay time of the delay-locked clock signals MIXOUT_R and MIXOUT_F in synchronization with the update reference clock signal P2.

The mode control unit 50 receives fast mode control signals FM_PDOUT_R and FM_PDOUT_F and normal mode control signals CO_R, FI_R, CO_F and FI_F and then generates fast mode locking signals FAST_MODE_END and FAST_MODE_ENDF and normal locking signals LOCK_STATE and LOCK_STATEF. The fast mode locking signals FAST_MODE_END and FAST_MODE_ENDF are signals to control the starting and ending time of the fast locking operation and the normal locking signals LOCK_STATE and LOCK_STATEF are signals to control the coarse and fine delay units, which are included in the first and second delay units 40A and 40B, respectively. The normal locking signals LOCK_STATE and LOCK_STATEF are produced in response to the coarse control signals CO_R and CO_F and the fine control signals FI_R and FI_L and the fast mode locking signals FAST_MODE_END and FAST_MODE_ENDF are produced in response to a fast mode control signal FM_PDOUTR. A reset signal RST is a signal for the reset operation of the mode control unit 50 and is provided from the DLL control unit 10.

The phase comparison unit 60 compares the phase of the reference clock signal REFCLK to the phase of a rising feedback clock signal FBCLKR and also compares the phase of the reference clock signal REFCLK to the phase of a falling feedback clock signal FBCLKF, thereby generating a resulting signal based on the comparison. The phase comparison unit 60, which compares the phase of the reference clock signal REFCLK to the phase of the rising feedback clock signal FBCLKR, generates the fast locking signal FM_PDOUT when the fast locking operation is required and also generates the normal locking signals COARSE and FINE when the normal locking operation is required. The fast locking operation rapidly adjusts the amount of the delay time when the delay-locked loop carries out the delay locking operation and the normal locking operation adjusts the amount of the delay time in a small range. In other words, the phase comparison unit 60 outputs the coarse signal COARSE to control the coarse delay in the first and second delay units 40A and 40B and the fine signal FINE to control the fine delay in the first and second delay units 40A and 40B. As mentioned above, the coarse and fine delay units are included in the first and second delay unit 40A and 40B, respectively. Further, the phase comparison unit 60, which compares the phase of the reference clock signal REFCLK to the phase of the falling feedback clock signal FBCLKF, generates the fast locking signal FM_PDOUTF when the fast locking operation is required and also generates the normal locking signals COARSEF and FINEF when the normal locking operation is required.

The duty correction unit 80 corrects the duty ratio of clock signals MIXOUT_R and MIXOUT_F respectively outputted from the first delay unit 40A and the second delay unit 40B and outputs the corrected value to the delay model 70. The delay model 70 generates the rising and falling feedback signals FBCLKR and FBCLKF by delaying the duty-corrected clock signals IFBCLKR and IFBCLKF by a modeling value. The modeling value is obtained by modeling a delay time taken until the clock signal is inputted into the semiconductor memory device and then transferred to the data output circuit. The clock driver 90 generates delay-locked clock signals IRCLKDLL and IFCLKDLL by using the duty-corrected clock signals IFBCLKR and IFBCLKF, A data output circuit outputs the data to an external circuit in response to the transition of the delay-locked clock signals IRCLKDLL and IFCLKDLL. When the semiconductor memory device outputs the data to the external circuit in response to the transition of the delay-locked clock signals IRCLKDLL and IFCLKDLL, it seems to the external circuit of the memory device that the data are accurately outputted in synchronization with the transition of the clock signal.

Figure 2:
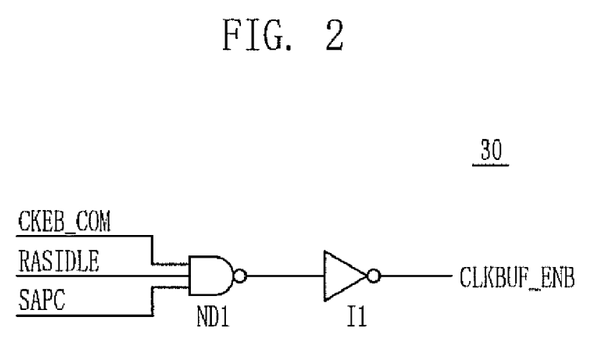
FIG. 2 is a schematic circuit diagram illustrating a buffer control unit of the semiconductor memory device in FIG. 1.

FIG. 2 is a schematic circuit diagram illustrating the buffer control unit 30 of the semiconductor memory device in FIG. 1. As shown in FIG. 2, the buffer control unit 30 includes a NAND gate ND1 to receive the internal clock enable signal CKEB_COM, the active idle signal RASIDLE and the MRS setting signal SAPC and an inverter I1 to output the clock buffer enable signal CLKBUF_ENB by inverting an output of the NAND gate ND 1.

Figure 3:
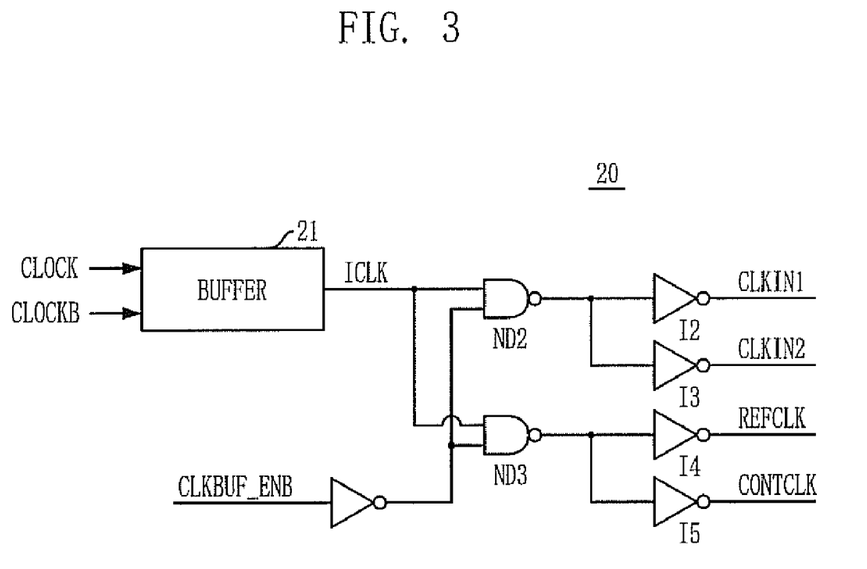
FIG. 3 is a schematic circuit diagram illustrating a clock buffer unit of the semiconductor memory device in FIG. 1.

FIG. 3 is a schematic circuit diagram illustrating the clock buffer unit 20 of the semiconductor memory device in FIG. 1. As shown in FIG. 3, the buffer unit 20, which is activated by the clock buffer enable signal CLKBUF_ENB, includes a buffer 21, NAND gates ND2 and ND3 and inverters I2 to I5 in order to generate the first and second internal clock signal CLKIN1 and CLKIN2, the reference clock signal REFCLK and the control clock REFCLK by buffering the inputted clock signals CLK and CLKB.

As apparent from the above, the semiconductor memory device is in a power-down mode when the data are not accessed and also is in a fast or slow power-down mode of a precharge power-down mode when the semiconductor memory device enters the precharge mode. The delay locked loop illustrated in FIG. 1 performs the normal delay locking operation in the fast power-down mode and does not perform the delay locking operation in the slow power-down mode. Concretely, the MRS setting signal SAPC which is not activated is inputted into the buffer control unit 30 in the slow power-down mode and the buffer control unit 30 to receive the inactivated MRS setting signal SAPC inactivates the clock buffer enable signal CLKBUF_ENB. When the clock buffer is inactivated, the delay locking operation is not progressed because the first and second internal clock signals CLKIN1 and CLKIN2 and the reference clock signal REFCLK and the control clock signal CONTCLK are not generated.

Meanwhile, since the delay locking operation is normally carried out in the fast power-down mode, the current is used up even if the memory device is in the power power-down mode. In the present invention, the delay locking operation of the power power-down mode is different from that of the normal mode in the period of time. As a result, the present invention provides a semiconductor memory device capable of reducing the current consumption.

Figure 4:
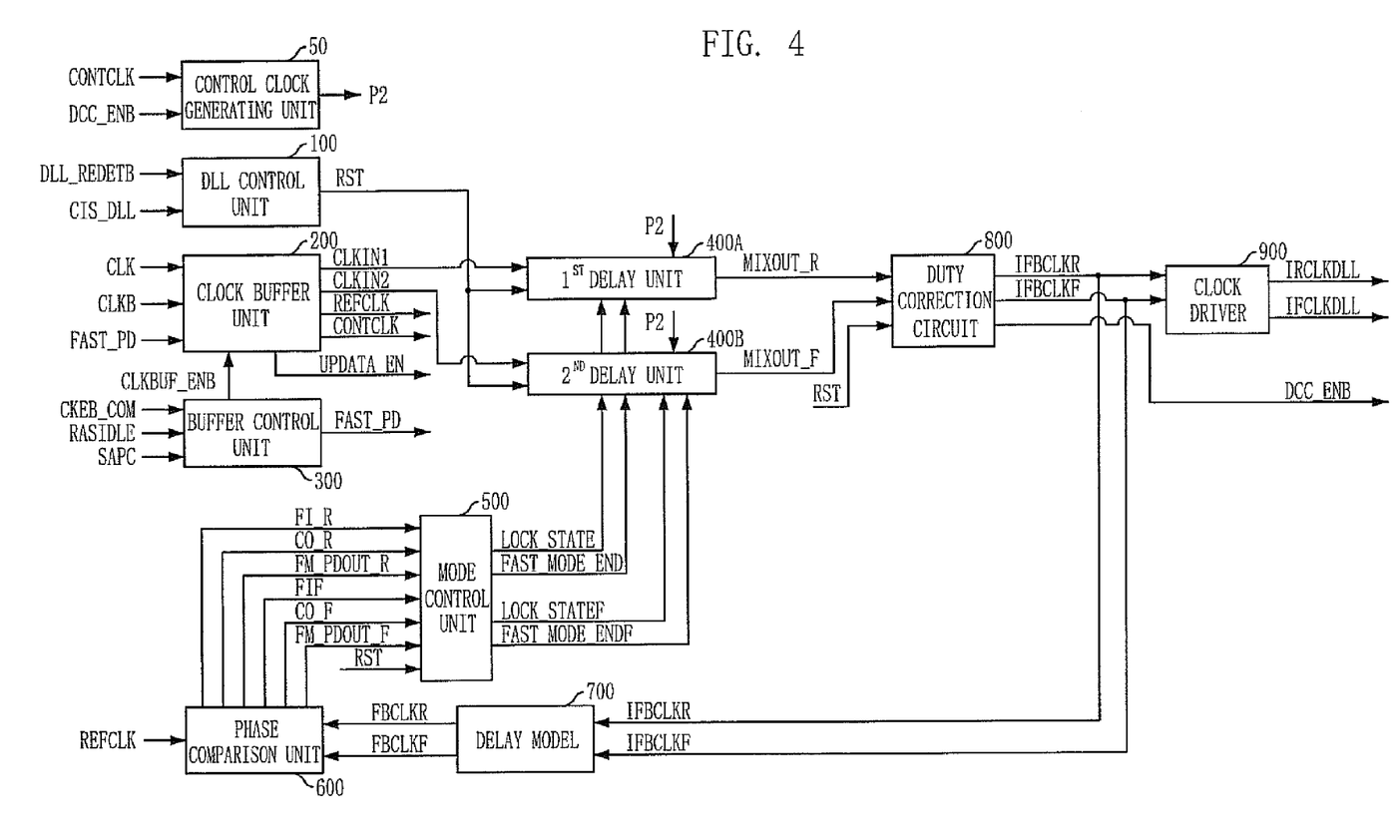
FIG. 4 is a block diagram illustrating a semiconductor memory device according to a first embodiment of the present invention.

FIG. 4 is a block diagram illustrating a semiconductor memory device according to the first preferred embodiment of the present invention. Referring to FIG. 4, the semiconductor memory device according to the present invention includes a control clock generating unit 50, a DLL control unit 100, a clock buffer unit 200, a buffer control unit 300, a first delay unit 400A, a second delay unit 400B, a mode control unit 500, a phase comparison unit 600, a delay model 700, a duty correction unit 800, and a clock driver 900. The operations of the control clock generating unit 50, the DLL control unit 100, the first delay unit 400A, the second delay unit 4008, the mode control unit 500, the phase comparison unit 600, the delay model 700, the duty correction unit 800 and the clock driver 900 are the same as those of the elements shown in FIG. 1.

The buffer control unit 300 receives an active idle signal RASIDLE which is activated in response to an active mode, an internal clock enable signal CKEB_COM, an MRS setting signal SAPC having information of the MRS register to sense whether it is the fast precharge power-down mode or the slow precharge power-down mode and then generates a fast precharge power-down mode signal FAST_PD and a clock buffer enable signal CLKBUF_ENB. The clock buffer unit 200 to receive the clock signals CLK and LKB generates internal clock signals CLKIN1 and CLKIN2, a reference clock signal REFCLK and a control clock signal CONTCLK. Particularly, the clock buffer unit 200 is activated in response to the clock buffer enable signal CLKBUF_ENB in order to generate the internal clock signals CLKIN1 and CLKIN2, the reference clock signal REFCLK and the control clock signal CONTCLK. However, the clock buffer unit 200 generates the reference clock signal REFCLK and the control clock signal CONTCLK based on the scheduled numbers of cycles in a state where the fast power down mode signal FAST_PD is activated. That is, the clock buffer unit 200 generates the internal clock signals CLKIN1 and CLKIN2, the reference clock signal REFCLK and the control clock signal CONT-CLK based on the scheduled numbers of cycles while the fast precharge power-down mode signal FAST_PD is activated and then inputted thereto. It should be noted that the clock buffer unit 200 does not generate the internal clock signals CLKIN1 and CLKIN2, the reference clock signal REFCLK and the control clock signal CONTCLK every periods, but based on the predetermined constant cycles.

Accordingly, in the semiconductor memory device according to the first preferred embodiment of the present invention, the delay locking operation is not always (that is, in every cycle) made in the fast precharge power down mode, but in each one of a predetermined, fixed number of cycles during the fast precharge power down mode. In the conventional semiconductor memory device, when it enters the fast precharge power-down mode while it accesses the data using the delay locked clock signal, the delay locking operation is still carried out during the data access. Therefore, large current is unnecessarily wasted in the fast precharge power-down mode. However, in the semiconductor memory device according to the present invention, the delay locking operation is not continuously carried out (that is. in every cycle of the fast precharge power-down mode) after it enters the fast precharge power-down mode, but the delay locking operation is carried out during a predetermined numbers of cycles of the power-down mode to reduce the current consumption. Since the delay locked loop would have already output the delay locked clock signals before entering the fast precharge power-down mode, a fine adjustment of the delay locked clock signals is performed during the fast precharge power-down mode. if the fast precharge power-down mode expires, the delay locked clock signals are outputted immediately from the delay locked loop circuit and the semiconductor memory device outputs the data in response to the delay locked clock signals so that the data access time is effectively reduced at the time of the expiration of the fast precharge power-down mode. For example, in this embodiment of the present invention, the delay locking operation is carried out during 32 clock periods in every 1024 clock signals/periods of the fast precharge power-down mode.

Figure 5:
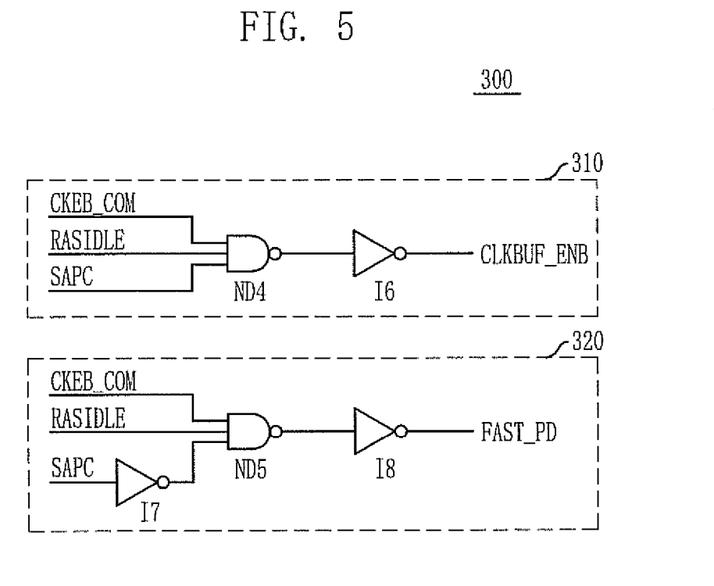
FIG. 5 is a schematic circuit diagram illustrating the buffer control unit of the semiconductor memory device in FIG. 4.

FIG. 5 is a schematic circuit diagram illustrating the buffer control unit 300 of the semiconductor memory device in FIG. 4. Referring to FIG. 5, the buffer control unit 300 includes a clock buffer enable signal generating unit 310 and a mode signal generating unit 320. The clock buffer enable signal generating unit 310 includes a NAND gate ND4 to receive the active idle signal RASIDLE, the internal clock enable signal CKEB_COM, the MRS setting signal SAPC and an inverter I6 to output the clock buffer enable signal CLKBUF_ENB by inverting an output of the NAND gate ND4. The mode signal generating unit 320 includes an inverter I7 to output an inverted signal of the MRS setting signal SAPC, a NAND gate ND5 to receive the active idle signal RASIDLE, the internal clock enable signal CKEB_COM and an output of the inverter I7 and an inverter I8 to invert an output of the NAND gate ND5.

Figure 6:
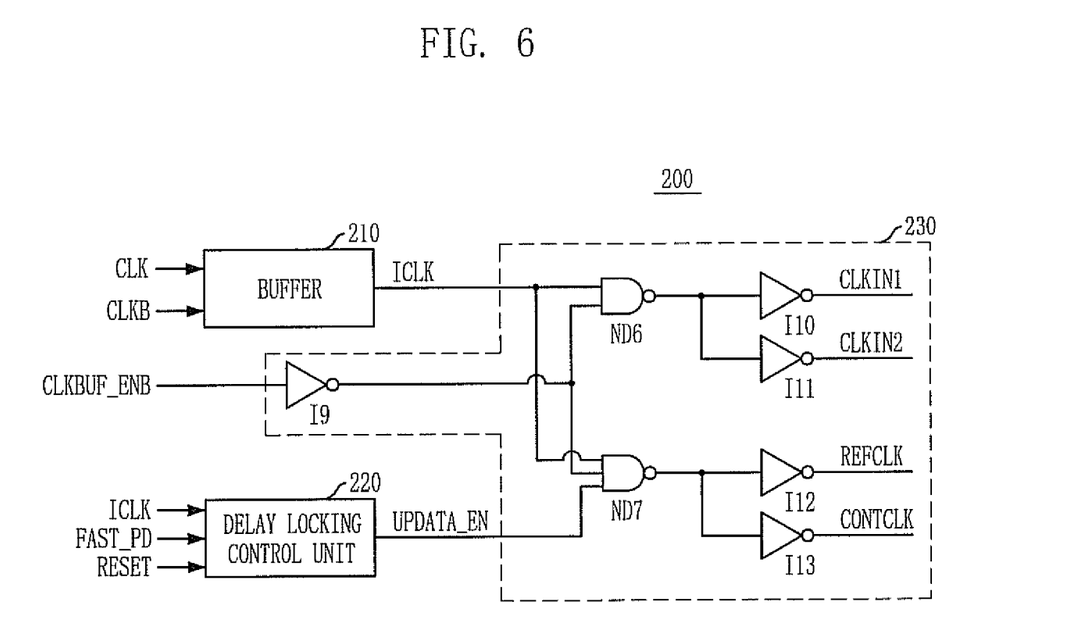
FIG. 6 is a schematic circuit diagram illustrating a clock buffer unit of the semiconductor memory device in FIG. 4.

FIG. 6 is a schematic circuit diagram illustrating a clock buffer unit 200 of the semiconductor memory device in FIG. 4. Referring to FIG. 6, the clock buffer unit 200 includes a buffer 210 to output an internal clock signal ICLK by buffering the clock signals CLK and CLKB, a delay locking control unit 220 to receive the fast power-down mode signal FAST_PD for generating an update signal UPDATA_EN, and a clock transfer unit 230 to transfer the internal clock signals CLKIN1, CLKIN2, REFCLK and CONTCLK in response to the clock buffer enable signal CLKBUF ENB and the update signal UPDATA_EN.

Figure 7:
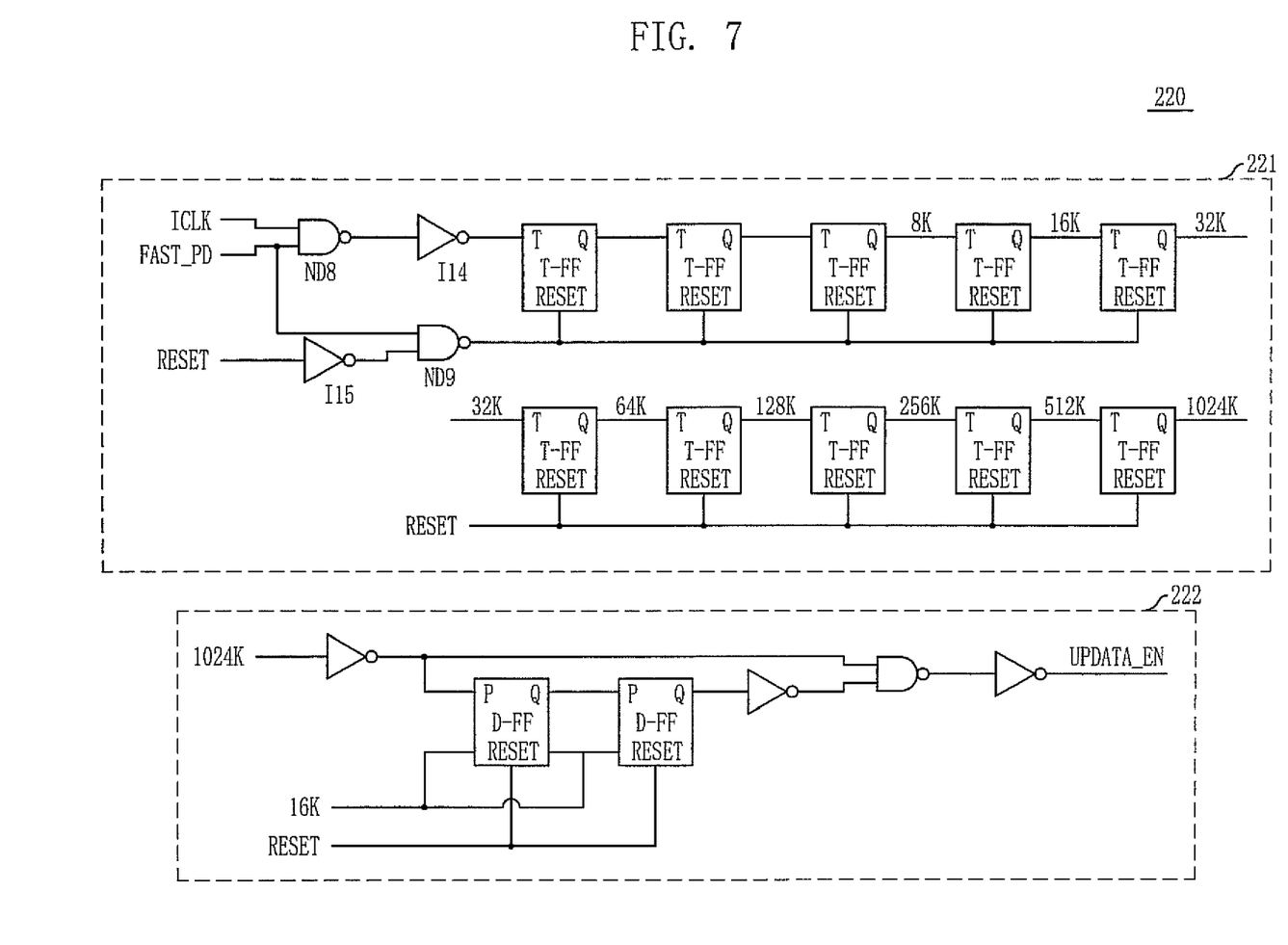
FIG. 7 is a schematic circuit diagram illustrating a delay locking control unit of the clock buffer unit in FIG. 6.

FIG. 7 is a schematic circuit diagram illustrating the delay locking control unit 220 of the clock buffer unit in FIG. 6. The delay locking control unit 220 includes a period signal generating unit 221 to generate the clock signals of different periods using the internal clock signal ICLK and an update signal generator 222 to receive the clock signals (1024K) from the period signal generating unit 221 and to generate the update signal UPDATA_EN in response to the clock signals (16K) as a reference signal. Particularly, the period signal generating unit 221 is activated in response to the fast precharge mode signal FAST_PD, including a plurality of T flip-flops which are in series connected each other in such a manner that the front stage thereof receives the internal clock signal ICLK.

Figure 8:
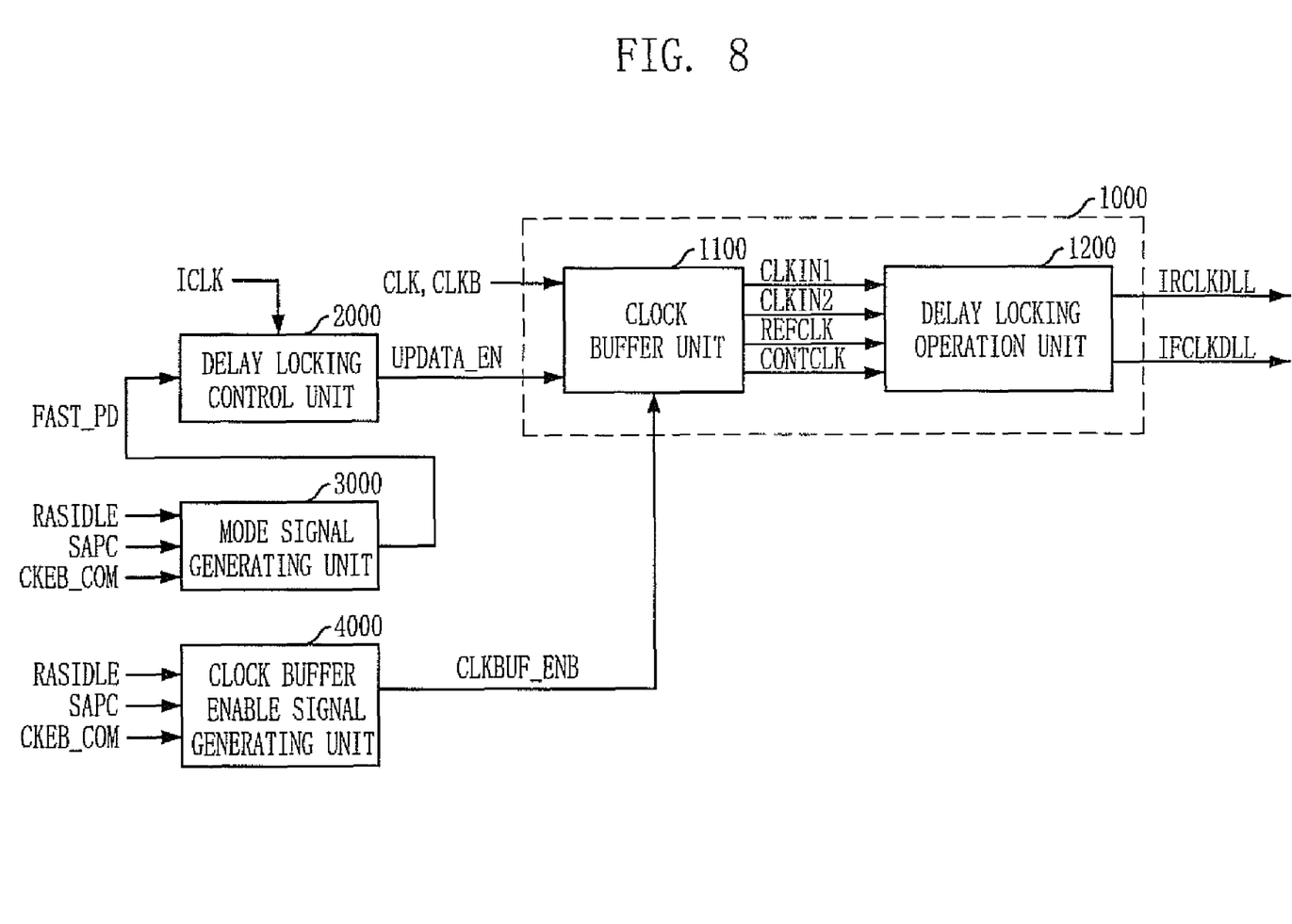
FIG. 8 is the block diagram illustrating the semiconductor memory device according to a second embodiment of the present invention.

FIG. 8 is the block diagram illustrating the semiconductor memory device according to the second preferred embodiment of the present invention. Referring to FIG. 8, the semiconductor memory device according to the second preferred embodiment of the present invention includes a delay locked loop 1000 having a clock buffer unit 1100 and a delay locking operation unit 1200 for performing the delay locking operation, a delay locking control unit 2000, a mode signal generating unit 3000, and a clock buffer enable signal generating unit 4000. The clock buffer unit 1100 performs the same function as the clock buffer unit 200 of FIG. 4 and the delay locking operation unit 1200 includes all the circuits in FIG. 4, except for the clock buffer unit 200. The delay locking control unit 2000 performs the same function as the delay locking control unit 220 of FIG. 6. The mode signal generating unit 3000 performs the same function as the mode signal generating unit 320 of FIG. 5 and the clock buffer enable signal generating unit 4000 performs the same function as the clock buffer enable signal generating unit 310.

The detailed description will be omitted because each of the circuit blocks in FIG. 8 performs the same functions as that illustrated above. Similar to the semiconductor memory device of FIG. 4, the semiconductor memory device of FIG. 8 can reduce the current consumption because the delay locking operation does not operate every cycle signals in the fast precharge power-down mode, but is carried out based on the scheduled numbers of cycles.

As apparent from the above, the semiconductor memory device according to the present invention reduces the amount of the current used up in the power-down mode. Therefore, when the semiconductor memory device is applied to a low power system or a mobile system, the current consumption is reduced.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device comprising:
a clock buffer unit for generating a reference and an internal clock signal in response to a clock signal;
a clock buffer control unit for activating the clock buffer unit for a predetermined number of cycles in a fast precharge power-down mode, wherein the clock buffer control unit is configured to not activate the clock buffer unit at every cycle of the fast precharge power-down mode; and
a delay locked loop for performing a delay locking operation on the internal clock signal and generating a delay locked clock signal,
wherein the clock buffer control unit includes a delay locking control unit to generate a control signal in response to a fast precharge power-down mode signal and activate the clock buffer control unit for the predetermined number of cycles during the fast precharge power-down mode.

2. The semiconductor memory device of claim 1, wherein the clock buffer control unit further comprises:
   a mode signal generating unit for enabling the fast precharge power-down mode signal in the fast precharge power-down mode.

3. The semiconductor memory device of claim 2, wherein the delay locking control unit is configured to generates the control signal by dividing the clock signal.

4. The semiconductor memory device of claim 3, wherein the mode signal generating unit for generating the fast precharge power-down mode signal in response to an active idle signal, a clock enable signal, and a mode register set(MRS) information for sensing whether an active mode is a fast precharge power-down mode or a slow precharge power-down mode and the active idle signal is enabled during the active mode.

5. The semiconductor memory device of claim 4, wherein the delay locking control unit includes:
   a plurality of flip-flops connected in series to each other and activated in response to the fast precharge power-down mode signal, wherein a flip-flop of the plurality of the series-connected flip-flops at one end receives the internal clock signal; and
   a control signal generating unit for outputting, in response to an output signal of a first flip-flop selected from the plurality of the flip-flops, an output signal of a second flip-flop selected from the plurality of the flip-flops as the control signal.

6. A method for driving a semiconductor memory device comprising:
   generating a reference clock signal and an internal clock signal by using a clock signal;
   selectively generating the reference clock signal for a predetermined number of cycles in a fast precharge power-down mode. wherein the reference clock signal is not activated at every cycle of the fast precharge power-down mode; and
   generating a delay locked clock signal through a delay locking operation by using the reference clock signal and the internal clock signals.

7. The method of claim 6, wherein the selective generation of the reference clock signal includes:
   generating a mode signal by using an active signal, a clock enable signal, and a mode register set (MRS) information indicative of a the fast precharge power-down mode or a slow precharge power-down mode and the active signal is enabled in response to an active mode; and
   selectively generating the reference clock signal in response to the mode signal.

\* \* \* \* \*